United States Patent
Bluhm et al.

(10) Patent No.: US 12,148,860 B2
(45) Date of Patent: Nov. 19, 2024

(54) OPTICALLY ACTIVE QUANTUM DOT DEFINED BY GATES

(71) Applicant: Rheinisch-Westfälische Technische Hochschule (RWTH) Aachen, Aachen (DE)

(72) Inventors: Hendrik Bluhm, Aachen (DE); Feng Liu, Aachen (DE); Thomas Descamps, Aachen (DE)

(73) Assignee: Rheinisch-Westfälische Technische Hochschule (RWTH) Aachen, Aachen (DE)

( * ) Notice: Subject to any disclaimer, the term of this patent is extended or adjusted under 35 U.S.C. 154(b) by 453 days.

(21) Appl. No.: 17/642,445

(22) PCT Filed: Sep. 10, 2020

(86) PCT No.: PCT/DE2020/100789
§ 371 (c)(1),
(2) Date: Mar. 11, 2022

(87) PCT Pub. No.: WO2021/047736
PCT Pub. Date: Mar. 18, 2021

(65) Prior Publication Data
US 2022/0344541 A1  Oct. 27, 2022

(30) Foreign Application Priority Data

Sep. 13, 2019  (DE) .............. 10 2019 006 472.0

(51) Int. Cl.
*H01L 33/38*   (2010.01)
*H01L 33/30*   (2010.01)

(52) U.S. Cl.
CPC .............. *H01L 33/38* (2013.01); *H01L 33/30* (2013.01)

(58) Field of Classification Search
CPC ....................................... H01L 33/30
See application file for complete search history.

(56) References Cited

U.S. PATENT DOCUMENTS

| 5,048,907 A | 9/1991 | Wickman et al. |
| 10,840,408 B1 * | 11/2020 | Yin ........................ H01L 33/025 |

(Continued)

FOREIGN PATENT DOCUMENTS

| CN | 107275452 A | 10/2017 |
| DE | 69120479 | 2/1997 |

(Continued)

OTHER PUBLICATIONS

High, A. A., et al. "Trapping indirect excitons in a GaAs quantum-well structure with a diamond-shaped electrostatic trap." Physical review letters 103.8 (2009): 087403.

(Continued)

*Primary Examiner* — Yu-Hsi D Sun
(74) *Attorney, Agent, or Firm* — Smartpat PLC

(57) ABSTRACT

An electronic component (10) for generating and emitting electromagnetic waves or single photons (48) comprises a layer system (12) of semiconductor materials. A middle layer (13) of gallium arsenide is arranged between a first layer (14) of aluminum gallium arsenide and a second layer (16) of aluminum gallium arsenide. A first outer layer (18) of gallium arsenide is provided on the first layer (14) of aluminum gallium arsenide; A second outer layer (20) of gallium arsenide is provided on the second layer (16) of aluminum gallium arsenide.

6 Claims, 2 Drawing Sheets

(56) References Cited

U.S. PATENT DOCUMENTS

2004/0197070 A1   10/2004   Takemoto et al.
2006/0032529 A1    2/2006   Rand et al.
2021/0111362 A1    4/2021   Seo et al.

FOREIGN PATENT DOCUMENTS

DE   602005004925          2/2009
DE   102016218696 A1       3/2017
JP     2010045329 A        2/2010

OTHER PUBLICATIONS

Schinner, G. J., et al. "Electrostatically trapping indirect excitons in coupled In x Ga 1-x As quantum wells." Physical Review B 83.16 (2011): 165308.

* cited by examiner

OPTICALLY ACTIVE QUANTUM DOT DEFINED BY GATES

TECHNICAL FIELD

The invention relates to an electronic component for generating and emitting electromagnetic waves or individual photons, comprising a layer system of semiconductor materials.

BACKGROUND

Electronic components are used in technology to produce electromagnetic waves, in particular light. The LED (light-emitting diode) is, for example, a light-emitting semiconductor component. Thus, in particular, the light bulb, fluorescent tubes, and other illuminants are being replaced with the LED technology due to their high efficiency, and therefore low energy consumption. A very wide range of spectra can be covered with LEDs. In addition, semiconductors are also suitable for use as semiconductor lasers or laser diodes for generating laser light.

Quantum dots are generated in semiconductors such as, for example, InGaAs or CdSe. The layer thickness of the semiconductor materials is in the range of one to several hundred atomic layers, i.e. at the nanoscopic scale. Due to the small scale, the mobility of charge carriers in quantum dots is restricted to such an extent that they can no longer assume continuous states and can only assume discrete states. Charge carriers are usually either electrons or electron holes, which are also referred to simply as holes, in the semiconductor.

An electron bound in an insulator or in a semiconductor and a hole form an electron-hole pair. In a semiconductor, such an electron-hole pair behaves in many ways, especially when viewed from a quantum mechanical perspective, like a hydrogen atom. This quasiparticle in the solid is also referred to as an exciton. An exciton is formed in a semiconductor, for example when a photon causes an electron to jump from the valence band to the conduction band.

Conventional computers use semiconductor components with integrated circuits. These circuits always work with systems which are based on a logical "0" or "1"—i.e. the switch is "on" or "off". In semiconductor memories, this is realized in that the potential is either above or below a threshold value.

To significantly increase computing power, models for so-called quantum computers have long been known. For various reasons, though, it has not yet been technically possible to realize quantum computers of sufficient size. The models of quantum computers are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

Single-photon sources play a key role in photonic quantum technology. In recent years, substantial research effort has been made to develop a single-photon source capable of deterministically generating individual photons with high single-photon purity and indistinguishability. For a scalable integrated quantum technology, additional conditions need to be met: 1. Photons can be coupled to waveguides on a chip; 2. The energies of the photons from different emitters can be tuned to resonance; 3. The single-photon source can be generated deterministically at a desired position. The coherent control of the resonance of individual self-organized quantum dots in a micropillar resonator offers almost ideal performance (purity of the single photon: 99.1%, indistinguishability: 98.5%) when they are emitted into free space. However, the coupling of the micropillar cavity with on-chip waveguides is quite challenging. In addition, the large inhomogeneous broadening (typically several tens of meV) of the ensemble of self-organized quantum dots compared to the small electrical tuning range (<0.4 meV) demonstrated in this device indicates that the mass production of such single-photon sources having the same photon energy will be difficult. The direct integration of self-organized quantum dots into a nanobeam waveguide or photonic crystal waveguide is possible, but the photon coherence, and thus the indistinguishability, is poorer due to the significant dephasing caused by the charge noise of the etched surfaces in the vicinity of the quantum dots. Recently, an on-chip single-photon source that fulfills most of the requirements stated above was demonstrated based on a waveguide-coupled photonic crystal cavity (PhCC) containing randomly arranged quantum dots. The mass production of such a single-photon source requires precise control of the position of the quantum dot. Although the production of site-controlled quantum dots in PhCC has been demonstrated, photonic coupling between remote quantum dots on the chip has not been achieved yet because it is difficult to realize independent electrical tuning of different site-controlled quantum dots on the same chip.

Nitrogen/silicon vacancies (NV/SiV) in diamond have also been intensively explored as a single-photon source. Although entanglement and teleportation between remote NV centers has been demonstrated, there are still several problems that limit the generation of single photons: 1. Only a very small portion (~3%) of the photons is emitted into the usable zero photon line (ZPL); 2. The long radiative lifetime limits the brightness of the photon source. Numerous efforts are focused on overcoming these two problems by integrating NV centers in cavities. In comparison to NV centers, the SiV center is a more suitable candidate due to a weaker coupling to the phonon sideband, a lower inhomogeneous broadening, and a nearly transform-limited linewidth. The exact positioning of the SiV centers in a cavity/waveguide and the coherent control of the optical transitions has been demonstrated, but a complete evaluation of its performance as a single-photon source in on-demand operation (excited by a π-pulse) is not available. Additional disadvantages of the diamond color centers include: 1. The deterministic generation of a single color center at a desired position has not been demonstrated yet. 2. Diamond is more difficult to micromachine than GaAs.

Colloidal nanocrystals (NCs) have also attracted much attention due to their ability to generate a single photon at room temperature and their low manufacturing cost. Up to now, though, studies of colloidal NCs as a single-photon source are primarily limited to measurement of the purity of the single photon. There is still a long way to go until it will become possible to demonstrate a high-quality single-photon emission comparable to that of self-organized systems.

The optically active gate-defined (GD) quantum dot has great potential to meet all requirements. An optically active GD quantum dot that traps a single indirect exciton has already been demonstrated. However, the long radiative lifetime (T1~100 ns) of the indirect exciton significantly limits the brightness of the quantum dot and the photon indistinguishability, which is determined by the ratio of the coherence time to the radiative lifetime T2/(2T1).

Overall, an ideal single-photon source that meets all requirements for integrated photonic quantum technology is not yet available. Novelty, attractiveness, and advantages compared to existing solutions.

A light-sensitive or photosensitive optoelectronic device is known from DE 60 2005 004 925 T2. More precisely, it is oriented towards organic light-sensitive/photosensitive optoelectronic devices with nanoparticles. Light-sensitive optoelectronic devices convert electromagnetic radiation into electricity. Solar cells, which are also referred to as photovoltaic (PV) devices, are a type of photosensitive optoelectronic device that are used specifically to generate electrical energy. When electromagnetic radiation with suitable energy acts on a semiconducting organic material, e.g. an organic molecular crystal (OMC) material or a polymer, a photon can be absorbed and produce an excited molecular state. The absorption of this energy is associated with an electron jumping from a bound state to a higher energy level. In an equivalent manner, the transport of a hole is associated with the hole moving from one energy level to another energy level. In organic thin-film photoconductors, it is generally assumed that the molecular state generated is an exciton, i.e. an electron-hole pair in a bound state, which is transported as quasiparticle. The excitons can exist for a considerably long time before pair recombination, which is due to the process of recombining the original electron and original hole with one another, in contrast to the recombination of holes and electrons from other pairs. In order to generate a photocurrent, the electron-hole pair is typically separated at a donor-acceptor interface between two dissimilar organic thin films in contact with one another. If the charges do not separate, they can recombine in a pair recombination process, which is also referred to as quenching, either radiatively, i.e. by emitting light with a lower energy than that of the incident light, or non-radiatively, i.e. by generating heat.

DE 10 2016 218 696 A1 describes a light-emitting element having a high emission efficiency and low drive voltage. The light-emitting element includes a guest material and a host material. The LUMO level of the guest material is lower than a LUMO level of the host material. An energy difference between the LUMO level and a HOMO level of the guest material is larger than an energy difference between the LUMO level and a HOMO level of the host material. The guest material has a function of converting triplet excitation energy into light emission. An energy difference between the LUMO level of the guest material and the HOMO level of the host material is greater than or equal to the energy of a light emission of the guest material. Excitons are formed by recombining electrons and holes injected from a pair of electrodes or the charge generation layer into the light emitting layer. Since the amount of host material is greater than that of the guest material, the host material is brought into an excited state through the generation of excitons. Since excitons have energy, a material in which excitons are formed is brought into an excited state. In the case where the formed excitation state of the host material is a singlet excitation state, the singlet excitation energy is transferred from the level of the host material to the level of the guest material, whereby the singlet excitation state of the guest material is formed.

DE 691 20 479 T2 relates in general to photonic devices, and also relates to special photonic devices having quantum well structures. A crystal waveguide or slab waveguide with a core having a quantum well structure is provided so that the lateral confinement of a light beam introduced into the core is achieved through the quantum-confined Stark effect (QCSE). The QCSE is an effect that relates to the shifting of lower photon energies of exciton resonances in quantum potential wells. Excitons are bound states of electron-hole pairs, which can arise as a function of the incident photon energy. At room temperature, excitons are so short-lived that their resonances play a subordinate role in the optical properties of solid materials. In quantum well structures, though, exciton resonances at room temperature are clearly perceptible and create quantum well structures with strong non-linear absorption properties. In the QCSE, an electric field, which is applied perpendicular to the plane of the quantum well core in the crystal waveguide, shifts these non-linear absorption properties created by the excitons. When the absorption properties created by the QCSE are shifted, the refractive index of the quantum well is necessarily also shifted. Due to these different phenomena, which underlie the QCSE and the linear optical Kerr effect, the mathematical relationship between the applied electric field and the change in the refractive index is dominated in the QCSE by quadratic terms and terms of higher order. This is in contrast to the linear optical Kerr effect, which is dominated by the linear term. One property of the QCSE, which represents a potential obstacle for the realization of components utilizing the effect in practice, is that the largest change in the absorption resulting from the QCSE occurs at approximately the same photon energy as the largest change in the refractive index. However, by selecting a suitable photon energy for the light beam introduced into the quantum well core, a substantial increase in the refractive index can be obtained without a correspondingly large change in the absorption. In order to laterally limit the propagation of a light beam through a crystal waveguide having a quantum well core, an electric field is applied over a selected area of the waveguide, approximately in line with the introduced light beam and essentially perpendicular to the plane of the core. Through controlled application of the electric field, the lateral propagation of the light within the crystal can be controlled while achieving low-loss transmission. It is assumed in this case that the correct photon energy has been selected. Optoelectronic devices can be produced based on the control of the lateral boundary of the light beam. The waveguide can be placed, for example, between two fiber-optic cables in order to modulate an optical signal transported by the cables.

The technical publication "PHYSICAL REVIEW LETTERS, 22 Mar. 2013, PRL 110, 127403 (2013)" describes the confinement and interaction of single indirect excitons in a voltage-controlled trap formed inside double InGaAs quantum wells. The quantum traps can be tuned via a voltage. In this case, the quantum traps include single and spatially indirect and long-living excitons. This is realized with coupled and double quantum wells with nanoscopic gates. This enables the study of the transition from confined multiexcitons to a single, electrostatically trapped indirect exciton. In the few exciton regimes, discrete emission lines are observed, which can be identified as resulting from a single dipolar exciton, a biexciton, and a triexciton, respectively. Their energetic splitting is well described by Wigner-like molecular structures reflecting the interplay of dipolar interexcitonic repulsion and spatial quantization.

The disadvantage of the known electronic components in this field is that the spatial position and emission wavelength of self-organized quantum dots are randomly or widely scattered. Furthermore, the optically active gates are limited to indirect excitons only. In this case, a quantum dot is defined that is based on double quantum wells. The indirect exciton has a very long lifespan. This has the disadvantage that it is not bright enough to be used as a single or entangled photon source.

SUMMARY

The object of the disclosure is to avoid the disadvantages of the prior art and to provide an electronic component that can be adequately used as a photon source and can be used in particular for coupling qubits of quantum computers.

The object is achieved in an electronic component for generating and emitting electromagnetic waves with a layer system comprising semiconductor materials. This layer system of semiconductor materials includes
  a) a middle layer of gallium arsenide is arranged between
    i. a first layer of aluminum gallium arsenide and
    ii. a second layer of aluminum gallium arsenide;
  b) a first outer layer of gallium arsenide is provided on the first layer of aluminum gallium arsenide;
  c) a second outer layer of gallium arsenide is provided on the second layer of aluminum gallium arsenide.

Metal contacts are provided as gate electrodes on the outer layers of gallium arsenide, which are connected to a voltage source.

The disclosure is based, inter alia, on the principle that only a single quantum well with a trapped exciton is required in the electronic. The single exciton is localized by applying a suitable voltage to the gate electrodes. The three-dimensional confinement for the single and direct exciton is enabled by means of the nanoscopic metal contacts on the two outer sides of the layer system. The quantum wells and the nanoscopic gate electrodes can be produced completely in the top-down manufacturing technique familiar to a person skilled in the art, which also solves a long-standing scalability problem. Since the electronic component is more likely to confine direct excitons than indirect excitons, the brightness of quantum dots is also significantly improved. This optically active electronic component can be used as a source for a single and/or entangled photon. The electronic component is therefore also preferably suitable for use for coupling qubits of a quantum computer. In principle, the invention can also be realized using other materials as long as they are comparable or have similar properties to gallium arsenide or aluminum gallium arsenide. These substitute materials can replace gallium arsenide or aluminum gallium arsenide accordingly.

In an advantageous embodiment of the electronic component, the thickness of the layer system is less than 200 nm. With this layer system thickness, it is possible to optimally define a quantum dot. In this manner, only discrete states can be assumed in the quantum dot. These discrete energy levels are required in particular for coupling qubits.

In a special embodiment of the electronic component for generating and emitting electromagnetic waves, each of the gate electrodes has a barrier gate and a confinement gate on the outer layer. The barrier gate and confinement gate enable the defined and tunable generation of the quantum well and the defined excitation of the quantum dot.

In a further aspect for the electronic component for generating and emitting electromagnetic waves with a layer system comprising semiconductor materials, the barrier gate at least partially encloses the confinement gate in the plane of the outer layer. In this case, the barrier gate encloses the confinement gate in such a manner that it leads to a particularly optimal form of the quantum well for the exciton.

In a special embodiment of the electronic component, the layer system comprises a plurality of alternately provided layers of aluminum gallium arsenide and gallium arsenide, wherein the metal contacts are provided on the outer sides of the outermost layers. In principle, only relatively few alternating layers of aluminum gallium arsenide and gallium arsenide are required. This makes construction of the electronic component relatively simple. However, physical properties in particular can arise in the membrane-like component that make a higher number of layers necessary.

An advantageous embodiment has been shown in that, for an electronic component for generating and emitting electromagnetic waves, the voltage source is designed such that it can be tuned. As a result of this, the electronic component can be easily optimized with respect to a photon source, for example in terms of the emission wavelength.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is best defined by the appended claims. The prior art cited is incorporated in its entirety to be part of the disclosure relating to the present invention.

DETAILED DESCRIPTION

Figure 1:
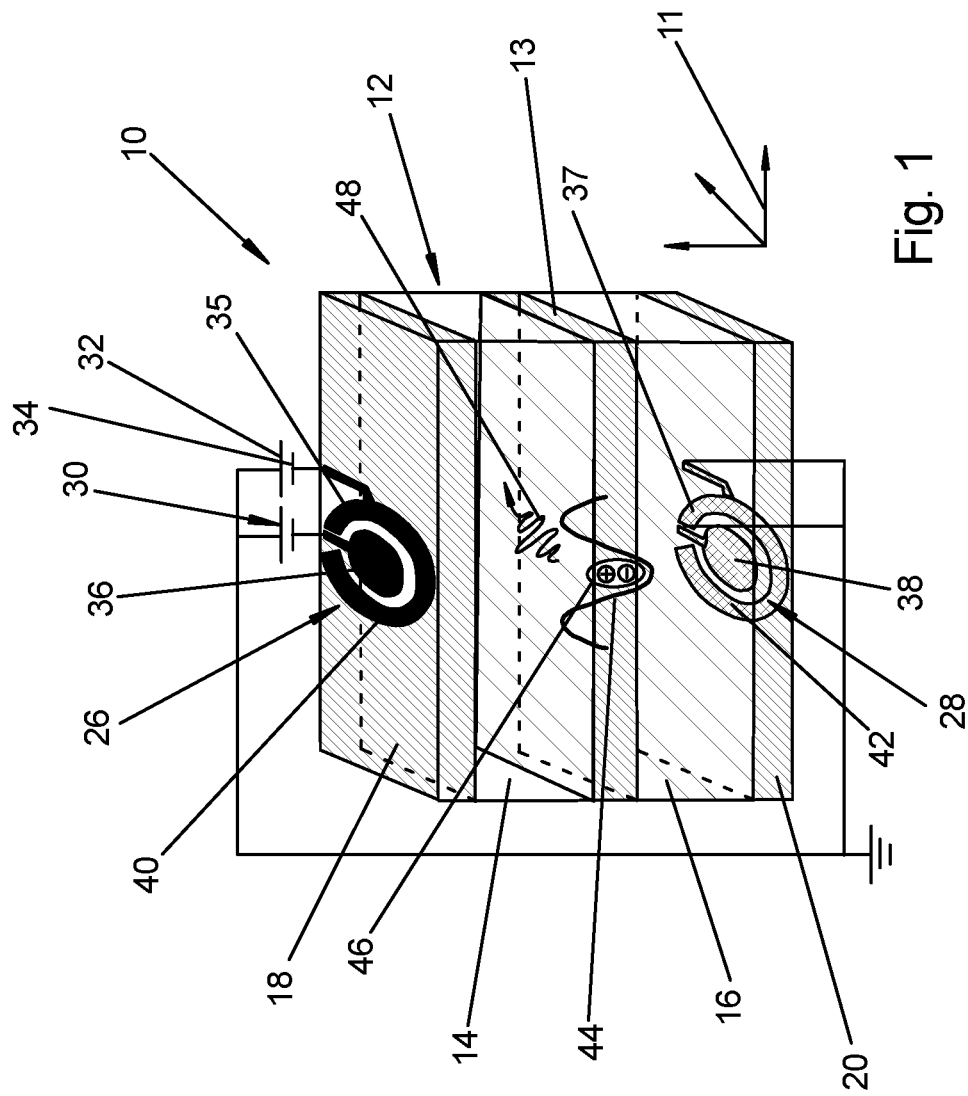
FIG. 1 shows a perspective view of a schematic diagram of an electronic component.

FIG. 1 shows a perspective view of a schematic diagram of an electronic component 10. The electronic component 10 is shown in a three-dimensional diagram, as is indicated by the coordinate system 11. The electronic component 10 has a thin layer system 12 with different semiconductor materials. The layer system 12 forms a membrane-like layer structure having a thickness in the range of 200 nanometers or less.

The layer system 12 comprises a middle layer 13 of gallium arsenide. The middle layer 13 is provided between a first layer 14 and a second layer 16 of aluminum gallium arsenide. On the outwardly facing surfaces of the two layers 14, 16 of aluminum gallium arsenide, there are additional outer layers 18, 20 of gallium arsenide. Metal contact arrangements 26, 28 are provided on the outer surfaces 22, 24 of these outer layers 18, 20. The metal contact arrangements 26, 28 are connected to voltage sources 30. The metal contact arrangements 26 in this case are connected to the negative pole 32 of the voltage sources 30. The positive pole 34 is connected to the metal contact arrangements 28 and/or ground.

The metal contact arrangements 26, 28 form gate electrodes 35, 37, each of which comprises a central confinement gate 36, 38 and a corresponding barrier gate 40, 42. The barrier gates 40, 42 enclose the central confinement gates 36, 38. In the present exemplary embodiment, both the barrier gates 40, 42 and the central confinement gates 36, 38 have a rounded shape.

A quantum well 44, in which an exciton 46 is confined, is formed by the middle layer 13. The bound exciton state 46 is generated in a targeted manner by applying voltage from the voltage sources 30 to the contact arrangements 26, 28. A single and/or entangled photon 48 is generated through recombination of the exciton 46. Such an electronic component 10 is therefore also suitable for exchanging information between qubits because it enables a quantum mechanical state to be transmitted.

Figure 2:
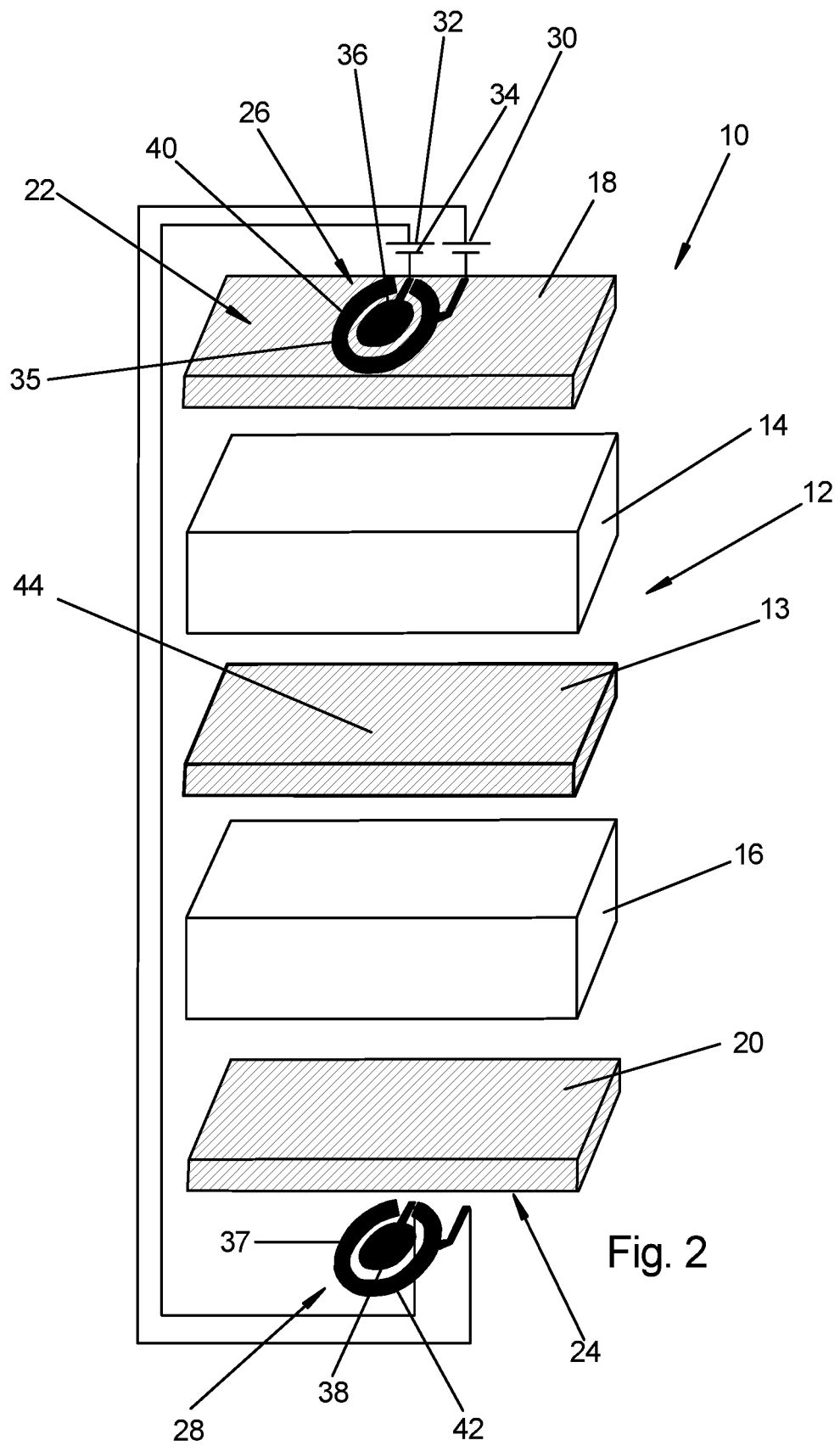
FIG. 2 shows a perspective exploded view of the electronic component.

In FIG. 2, the electronic component 10 according to FIG. 1 is shown schematically in a three-dimensional exploded view. This figure clearly illustrates the layer system 12 of the electronic component 10. The quantum well 44 is formed in the middle layer 13 of GaAs. The middle layer 13 is located between the semiconductor layers 14, 16 of AlGaAs. Said layers 13, 14, 16 are in turn located between the outer layers 18, 20 of GaAs.

The metal contact arrangements 26, 28 are formed as gate electrodes 35, 37. Each of the gate electrodes 35, 37 has a confinement gate 36, 38 and a barrier gate 40, 42 on the respective outer layer 18, 20. A voltage is applied to the gate electrodes 35, 37 in such a manner that an exciton 46, which emits a quantum mechanically defined photon 48 during recombination, is generated in the quantum well 44.

LIST OF REFERENCE SIGNS

10 Electronic component
11 Coordinate system
12 Layer system
13 Middle layer (GaAs)
14 First layer (AlGaAs)
16 Second layer (AlGaAs)
18 Outer layer (GaAs)
20 Outer layer (GaAs)
22 Outer surface
24 Outer surface
26 Metal contact arrangement
28 Metal contact arrangement
30 Voltage sources
32 Negative pole
34 Positive pole
35 Gate electrode
36 Central confinement gate
37 Gate electrode
38 Central confinement gate
40 Barrier gate
42 Barrier gate
44 Quantum well
46 Exciton
48 Photon

The invention claimed is:

1. An electronic component (10) for generating and emitting electromagnetic waves or individual photons (48), comprising:
a layer system (12) of semiconductor materials, including
a middle layer (13) of gallium arsenide arranged between
a first layer (14) of aluminum gallium arsenide and
a second layer (16) of aluminum gallium arsenide;
a first outer layer (18) of gallium arsenide provided on the first layer (14) of aluminum gallium arsenide;
a second outer layer (20) of gallium arsenide provided on the second layer (16) of aluminum gallium arsenide; and
metal contact arrangements (26, 28) as gate electrodes (35, 37) on the first outer layer (18) and the second outer layer (20), which are connected to a voltage source (30).

2. The electronic component (10) according to claim 1, wherein a thickness of the layer system (12) is less than 200 nm.

3. The electronic component (10) according to claim 1, wherein each of the gate electrodes (35, 37) has a barrier gate (40, 42) and a confinement gate (36, 38) on the respective outer layer (18, 20).

4. The electronic component (10) according to claim 3, wherein the barrier gate (40, 42) at least partially encloses the respective confinement gate (36, 38) in a plane of the respective outer layer (18, 20).

5. The electronic component (10) according to claim 1, wherein the middle layer (13), the first layer (14), and the second layer (16) are part of a plurality of alternately provided layers of aluminum gallium arsenide and gallium arsenide.

6. The electronic component (10) according to claim 1, wherein the electromagnetic waves or individual photons are light that is tunable by a voltage of the voltage source (30).

* * * * *